United States Patent [19]

Imai

[11] 4,393,577
[45] Jul. 19, 1983

[54] SEMICONDUCTOR DEVICES AND METHOD OF MANUFACTURING THE SAME

[75] Inventor: Kazuo Imai, Tokyo, Japan

[73] Assignee: Nippon Telegraph & Telephone Public Corp., Japan

[21] Appl. No.: 329,759

[22] Filed: Dec. 11, 1981

Related U.S. Application Data

[62] Division of Ser. No. 84,627, Oct. 12, 1979, abandoned.

[30] Foreign Application Priority Data

Oct. 27, 1978 [JP] Japan ................................. 53-132253
Oct. 27, 1978 [JP] Japan ................................. 53-132254
May 24, 1979 [JP] Japan ................................. 54-63252
Jun. 4, 1979 [JP] Japan ................................. 54-69001

[51] Int. Cl.³ .................... H01L 21/263; C25F 3/00
[52] U.S. Cl. .................................. 29/576 B; 29/571; 148/1.5; 148/187; 357/91
[58] Field of Search .................... 148/1.5, 187; 29/571, 29/576 B, 578; 357/91

[56] References Cited

U.S. PATENT DOCUMENTS 3,756,862  9/1973  Ahn et al. ............................. 148/1.5
3,918,996  11/1975  Morgan ............................... 148/1.5
3,919,060  11/1975  Pogge et al. ......................... 148/175
3,982,967  9/1976  Ku et al. .............................. 148/1.5

OTHER PUBLICATIONS

Ohmura et al., Phys. Stat. Solidi, 15a, (1973), 93.
Ohmura et al., Solid St. Comm., 11 (1972), 263.
Gorelkinskii et al., Phys. Stet. Sol., 22a, (1974), k55.

*Primary Examiner*—Upendra Roy
*Attorney, Agent, or Firm*—Thompson, Birch, Gauthier & Samuels

[57] ABSTRACT

In a semiconductor device of the type comprising a semiconductor substrate made of P type silicon, a P type monocrystalline silicon region formed on the major surface of the substrate and containing a P type impurity, and a porous silicon oxide region surrounding the P type silicon region, the porous silicon oxide region is made to contact all side surfaces of the P type silicon region and all or at least a portion of the bottom surface thereof.

11 Claims, 47 Drawing Figures

SEMICONDUCTOR DEVICES AND METHOD OF MANUFACTURING THE SAME

This application is a division, of application Ser. No. 084,627, filed Oct. 12, 1979, abandoned.

BACKGROUND OF THE INVENTION

This invention relates to a semiconductor device and a method of manufacturing the same, more particularly a semiconductor device wherein at least a portion of the lower surface and the side surfaces of semiconductor islands formed on the principal surface of a silicon semiconductor substrate are surrounded with porous silicon oxide, and a method of manufacturing such semiconductor device.

An IPOS (insulation by oxidized porous silicon) method of isolating semiconductor devices, and more particularly, isolation of elements of a semiconductor integrated circuit by using a porous silicon oxide (insulation by porous silicon oxide) has become widely used in the art because this method has the following advantageous features: (a) as the density of the porous silicon is only about 50% of that of monocrystalline silicon, the change in the volume caused by oxidation is small, and (b) as the speed of oxidation is extremely fast, porous silicon can be oxidized to a thickness of larger than 10 microns under a condition in which the monocrystalline silicon is oxidized to a thickness of only 1.0 micron. Accordingly, it is possible to form a relatively thick oxide film on the silicon substrate in a perfectly embedded state, thereby improving the element isolating capability. This technique provides a method for efficiently and readily fabricating integrated circuits at high density that are capable of operating at high speeds. A typical example of a semiconductor device whose elements are isolated by using the porous silicon oxide film is disclosed in U.S. Pat. No. 3,919,060 dated Nov. 11, 1975. The semiconductor device disclosed therein is prepared by epitaxially growing a N type silicon layer on a P type monocrystalline silicon substrate and then surrounding the N type silicon layer with a P type silicon region which is connected to the silicon substrate. Thereafter, the P type silicon region and the silicon substrate contiguous thereto are rendered porous by an anodizing technique. Then, the N type island region is surrounded by a heat oxidized silicon region by heat oxidizing the porous silicon region for insulating and isolating the N type island region from the other portions and the N type silicon region is converted into a channel thus obtaining a MIS type field effect transistor of the P channel type.

In the transistor of such construction, the P type silicon region is the source and drain region is in contact with the N type silicon region through a PN junction at only the side surfaces on their confronting inner sides so that the junction capacitance is small with the result that the transistor can operate at a high speed with a small energy consumption.

In such MIS type field effect transistor, however, since the channel region is constituted by the N type silicon region, the transistor is of the P channel type so that it is impossible to obtain an N channel type transistor capable of operating at a higher speed. More particularly, in the P channel type, the charge transmitting medium comprises holes whose speed is about one half of that of electrons comprising the charge transmitting medium for the N channel type. For this reason, in order to increase the operating speed, an N channel type transistor is more advantageous.

When one tries to prepare an N channel type transistor with the well known method described above, it is necessary to convert the N type island region into a P type. To this end, it is necessary to diffuse a group III impurity such as boron into the N type island region. According to this approach, however, it is necessary to make the quantity of the P type impurity to be diffused into the N type island region larger than that of the N type impurity with the result that the mobility of the carriers (electrons) in this region decreases and the resulting transistor does not have excellent characteristics. Furthermore, with this construction, in as much as the N type silicon island region is formed by an epitaxial growth method, the manufacturing cost of the element increases.

SUMMARY OF THE INVENTION

Accordingly, it is the principal object of this invention to provide a semiconductor device capable of operating at a high speed that can be fabricated at a high density, and a method of manufacturing such a semiconductor device.

Another object of this invention is to provide a semiconductor device wherein the elements thereof are more positively isolated and insulated than the prior art construction and hence characterized by a decrease in the junction capacitance and stray capacitance which permits high speed operation and high density fabrication, and a method of manufacturing such a semiconductor device.

Still another object of this invention is to provide a novel semiconductor device in which the isolated region and the substrate can be interconnected without directional property and it is possible to apply a proper bias potential to the isolated region from the silicon region, and a method of manufacturing such a semiconductor device.

Yet another object of this invention is to provide an improved semiconductor device capable of increasing the mobility of the carriers in the isolated region than the prior art construction, thereby reducing the power consumption, increasing the operating speed and suitable to be fabricated at a high density, and a method of manufacturing such a semiconductor device.

A further object of this invention is to provide a method of manufacturing a semiconductor device capable of accurately controlling the dimension of the isolated region and attaining various objects described above.

A still further object of this invention is to provide a method of manufacturing a semiconductor device of the type described above capable of improving the yield of satisfactory products while at the same time attaining various objects described above.

Still another object of this invention is to provide a method of manufacturing a semiconductor device of the type described capable of improving aligning accuracy by using self-aligning technique and simplifying the manufaturing steps while at the same time accomplishing various objects described above.

According to one aspect of this invention, there is provided a semiconductor device comprising a semiconductor substrate made of P type silicon, a P type monocrystalline silicon region formed on a major surface of the substrate and containing a P type impurity alone, and a porous silicon oxide region surrounding the P type silicon region, the porous silicon oxide region being in contact with all side surfaces of the P type silicon region and at least a portion of the bottom surface thereof.

According to another aspect of this invention, there is provided a method of manufacturing semiconductor device comprising the steps of selectively implanting proton ions into a major surface of a P type monocrystalline silicon substrate; heating the silicon substrate to form an N type monocrystalline silicon region; anodizing the substrate to form a porous silicon region extending in a thickness direction from the major surface of the P type monocrystalline substrate and not in the N type silicon region, the porous silicon region being formed to contact with all side surfaces and at least a portion of a bottom surface of the N type silicon region; and thermally oxidizing the porous silicon region for converting the same into a porous silicon oxide region while at the same time converting the N type silicon region into a P type silicon region.

BRIEF DESCRIPTION OF THE DRAWINGS

Further objects and advantages of the invention can be more fully understood from the following detailed description taken in conjunction with the accompanying drawings in which.

DESCRIPTION OF THE PREFERRED EMBODIMENTS

Figure 1:
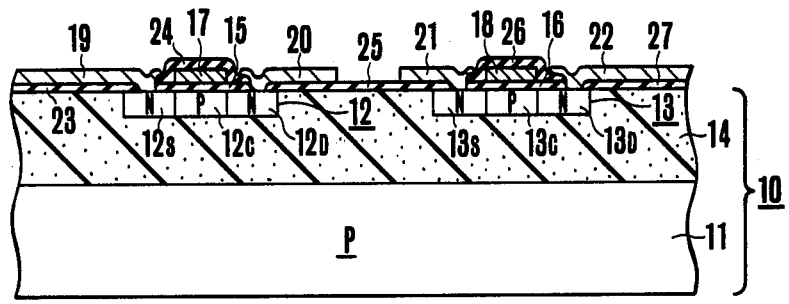
FIG. 1 is a longitudinal sectional view showing one embodiment of a semiconductor device according to this invention.

FIG. 1 shows one embodiment of the semiconductor device of this invention, more particularly, an N channel type MIS field effect transistor. As shown, a semiconductor substrate 10 comprises a P type silicon region 11, transistor regions 12 and 13 formed to oppose the major surface of the substrate, and a porous silicon oxide region 14 to surround not only the side surfaces but also the bottom surfaces of the transistor regions 12 and 13 so as to isolate them from each other and also from the P type region 11. The transistor regions 12 and 13 respectively comprise N type source regions 12S and 13S, P type channel regions 12C and 13C, and N type drain regions 12D and 13D. Gate insulating films 15 and 16 made of $SiO_2$, for example, are disposed to cover the channel regions 12C and 13C and portions of source 12S, 13S and drain 12D, 13D regions adjacent thereto. Gate electrodes and their wiring layer 17 and 18 are formed on the insulating films 15 and 16, respectively. On the surfaces of the source regions 12S and 13S and of the drain regions 12D and 13D are formed source electrodes, gate electrodes and their wiring layers 19, 20, 21 and 22 define through contact regions. Reference numerals 23, 24, 25, 26 and 27 denote insulating films made of $SiO_2$, for example.

The construction described above has the following advantages.

Firstly, since all of the side surfaces and the bottom surfaces of the transistor regions formed on the principal surface of the P type silicon substrate are isolated and insulated by the porous silicon oxide film, it is possible to reduce the stray capacitance and junction capacitance thus enabling the transistors to operate at high speed and to be fabricated at a high density. Moreover, since the P type silicon regions formed in the transistor regions are prepared by proton implantation and then converted into the P type by a heat treatment as will be described later, they have excellent crystalline property, the mobility of the carriers is large and the leak current is small. In other words, since these P type silicon regions do not contain any N type impurity, the decrease in the mobility of the carriers caused by scattering of the impurity can be minimized. For this reason, it is possible to obtain integrated circuit devices containing economic NMOS or bipolar transistors characterized by low power consumption and the capability of operating at high speeds.

Figure 2A:
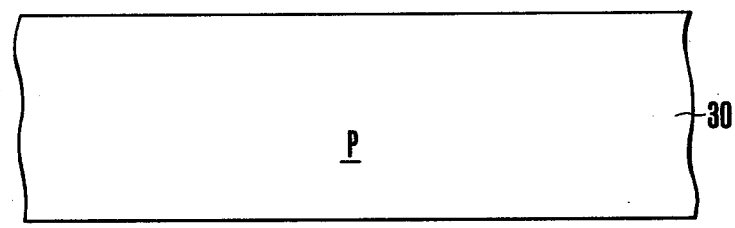
FIGS. 2A-2O are diagrammatic views showing one example of successive steps of manufacturing the semiconductor device shown in FIG. 1.
Figure 2B:
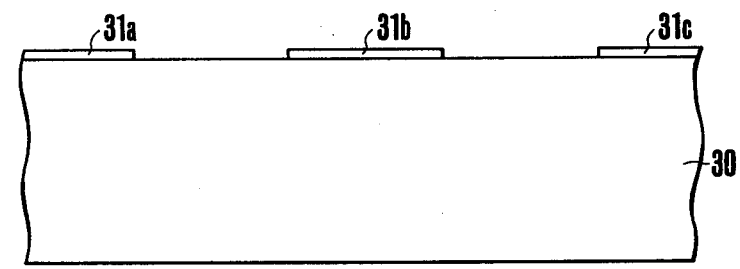
Figure 2C:
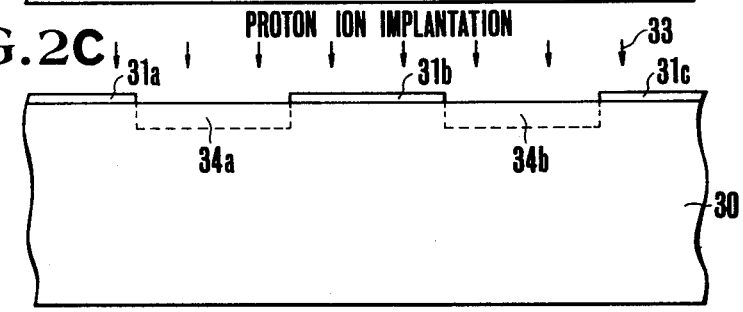
Figure 2D:
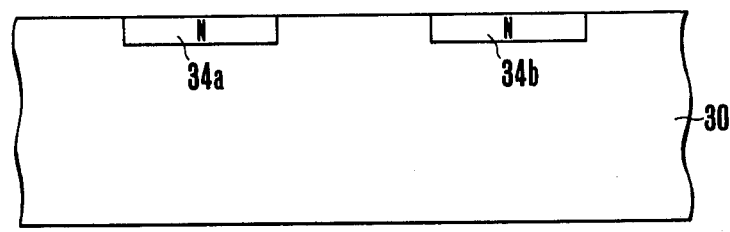
Figure 2E:
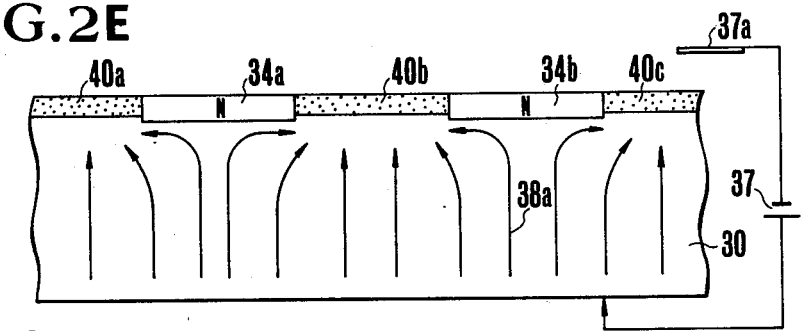
Figure 2F:
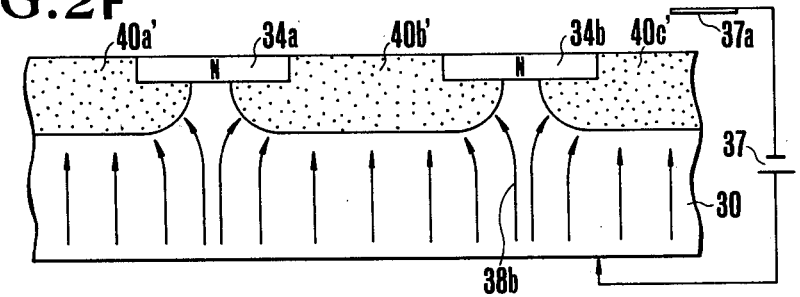
Figure 2G:
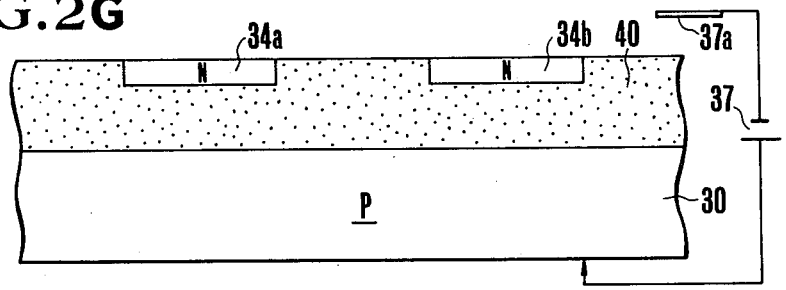
Figure 2H:
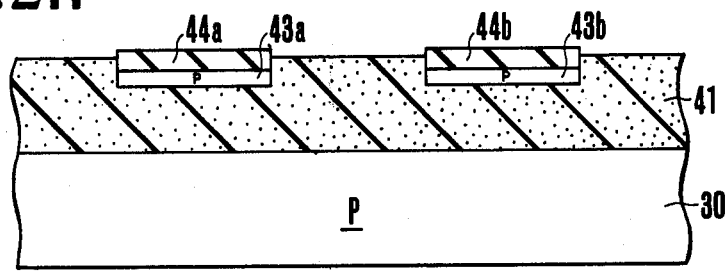
Figure 2I:
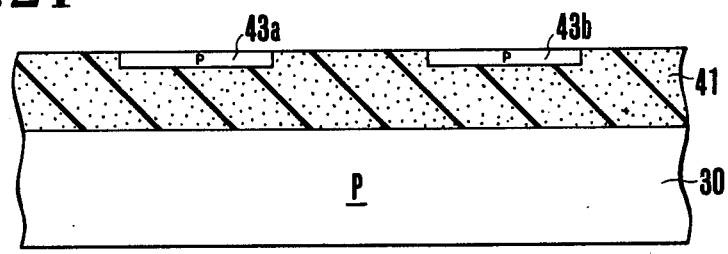
Figure 2J:
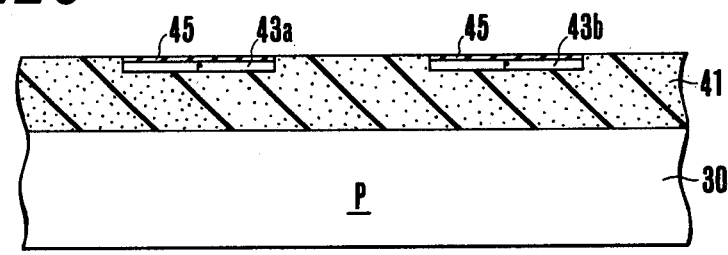
Figure 2K:
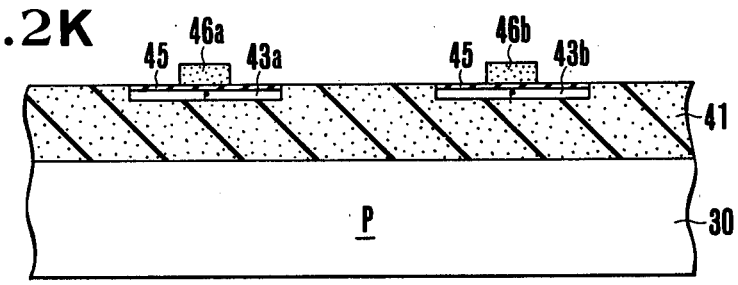
Figure 2L:
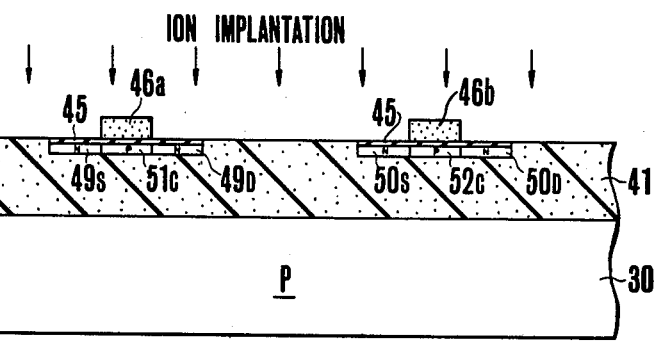
Figure 2M:
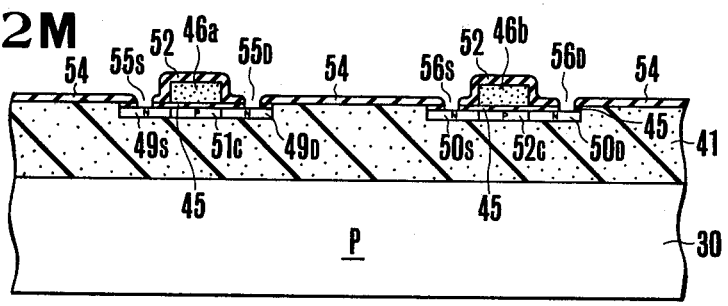
Figure 2N:
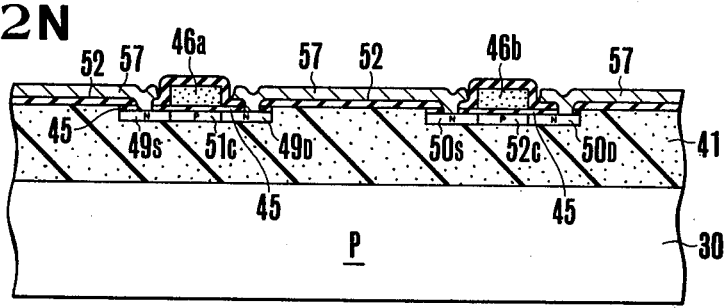
Figure 2O:
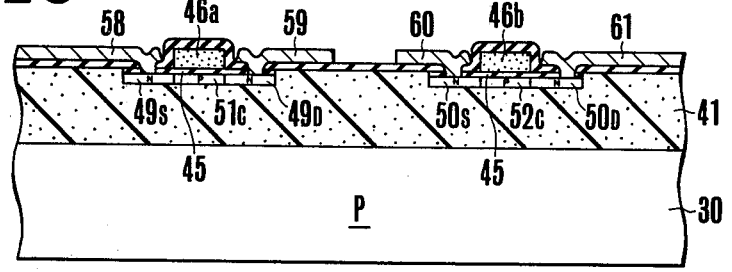

The semiconductor device shown in FIG. 1 can be fabricated by the manufacturing steps shown in FIGS. 2A through 2O.

At first, a semiconductor substrate 30 of the type shown in FIG. 2A is prepared having a crystal orientation of (100) plane, a specific resistance of 1-2 ohm cm, and a P type impurity concentration of $1 \times 10^{16}$ atoms/cm$^3$. Then, a mask layer having a thickness of about 1 micron is formed on the principal surface of the substrate 30 and the mask layer is then selectively etched to form mask layers 31a, 31b and 31c as shown in FIG. 2B. The mask layers may be composed of a photoresistive material, metals, silicon oxides, etc., so long as they can act as masks during the succeeding proton ion implantation step.

Then, proton ions are implanted into the surface of the substrate 30 in a direction shown by arrows in FIG. 2C, that is in a direction normal to the principal surface under an acceleration voltage of 100 KeV, to form proton ion implanted region 34a and 34b each having a thickness of about 0.8 micron. Thereafter, the mask layers 31a-31c are removed. If the mask layers are made of a photoresistive material, for example, they are removed with hot sulfuric acid. Then, the substrate is heat-treated in a nitrogen atmosphere, for example, at a temperature of 300° to 500° C. for 30 minutes. Since this heat-treatment is performed at a relatively low temperature, the proton implanted regions 34a and 34b are converted into N type monocrystalline regions 36a and 36b, as shown in FIG. 2D.

Figure 3:
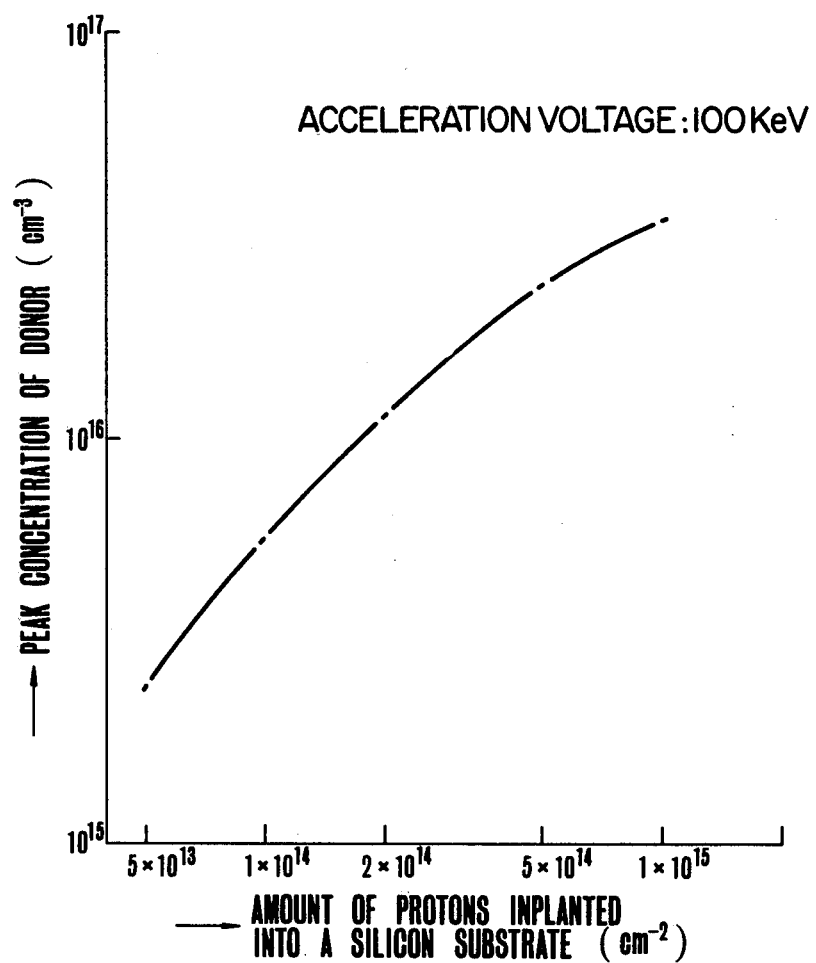
FIG. 3 is a characteristic curve showing the relationship between the amount of protons implanted or injected into a silicon substrate and the peak concentration of donor generated thereby.
Figure 4:
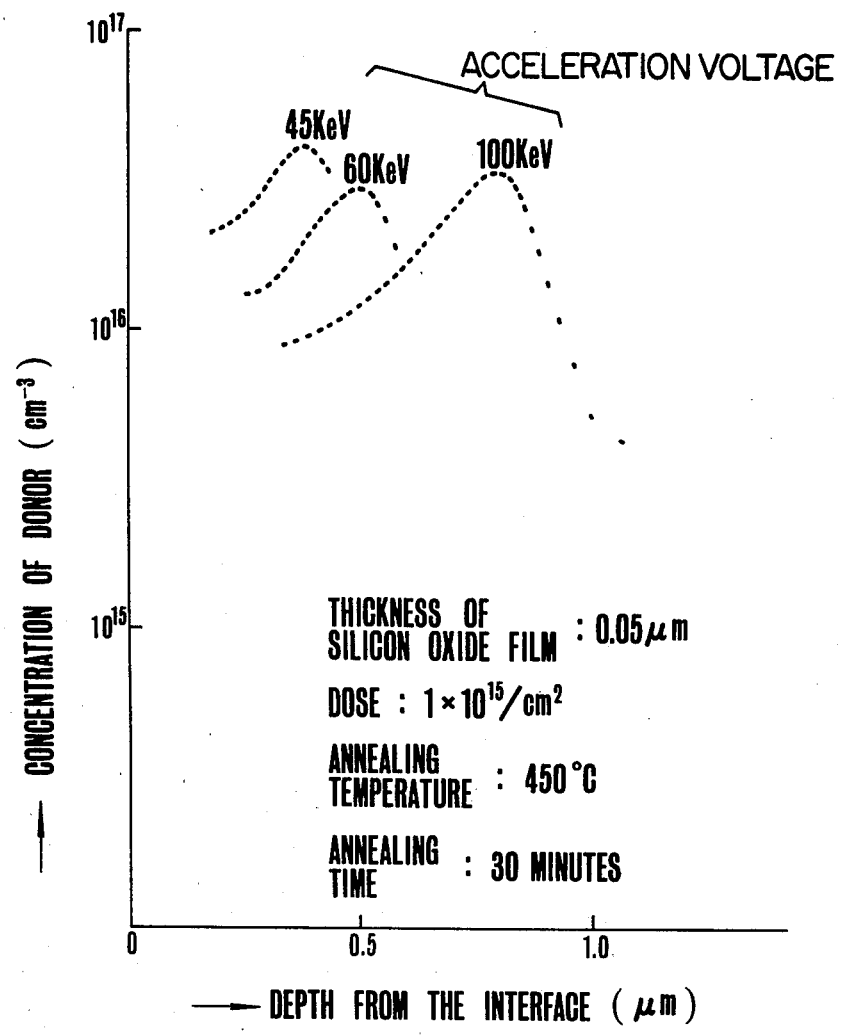
FIG. 4 is a graph showing the depth from the interface and the donor concentration when ions are implanted into a silicon substrate through a silicon oxide film wherein the implantation energy is taken as the parameter.

The relationship between the amount of protons implanted into the portions of the P type monocrystalline silicon substrate not covered by the masks, and the amount of donors produced thereby is shown in FIGS. 3 and 4. FIG. 3 shows the relationship between the amount of the implanted protons and the peak donor concentration in the substrate when the protons were implanted into the monocrystalline silicon substrate under an acceleration voltage of 100 KeV and then the substrate was annealed in a nitrogen atmosphere at a temperature of 450° C. for 30 minutes. FIG. 4 shows the relationship between the depth from the interface and the donor concentration when the amount of implanted protons, that is, the dose was $1 \times 10^{15}/cm^2$, the annealing temperature was 450° C. and the annealing time was 30 minutes for acceleration voltages of 45, 60 and 100 KeV. At this time, a silicon oxide film having a thickness of about 0.05 micron was applied to the portions of the interface where the protons were implanted.

It is essential that the temperature of heat treatment following the proton implantation step is lower than 500° C. If the heat treatments were performed at 550° C., the amount of donors would decrease, and if the temperature were increased to above 600° C., it was found that donors disappear completely. Such disappearance or decrease in the amount of that is caused by the heat treatment performed after creation of the donors by the proton implantation into silicon substrate is disclosed in a paper of Y. Ohmura, Y. Zohta and M. Kanazawa, Phys. Stat. Sol (a) 15,93 1973.

Then, the substrate 30 is dipped in a 25–30%, by weight, of a hydrofluoric acid (HF) solution. At this time, the bottom surface of the substrate is connected to the positive side of a DC source 37, while the negative side is connected to a platinum electrode 37a dipped in the solution as shown in FIG. 2E. At this time, the DC source 37 is connected to the substrate to supply thereto current at a density of 10 mA/cm² for 1000 seconds. This treatment is known as an anodic reaction. Since the P type monocrystalline silicon contains many holes, with the connection described above, the P type monocrystalline silicon is efficiently converted into a porous structure. On the other hand, since N type monocrystalline silicon does not contain any holes, it can not be converted into a porous structure. When the anodic reaction characteristic described above is used, anodic reaction current flows through the monocrystalline silicon substrate along paths 38a shown in FIG. 2E. Through the steps shown in FIG. 2E to FIG. 2F, the region thus converted into a porous structure reaches a depth of about 10 microns from the principal surface of the silicon substrate 30, thus forming a porous region 40 as shown in FIG. 2G. As can be noted from FIG. 2E, the anodic reaction forms porous silicon regions 40a, 40b and 40c at portions other than the N type silicon region and on the side of the principal surface of the P type silicon substrate. As the anodic reaction proceeds, the films of the porous silicon regions grow to a depth larger than that of the N type regions 34a and 34b and the porous silicon regions reach the bottom surfaces of the N type silicon regions as shown in FIG. 2F, because the anodizing current flows along paths 38a and 38b as shown in FIGS. 2E and 2F. For the purpose of preventing the anodizing current from flowing into the N type silicon regions 34a and 34b, the anodizing voltage should be less than the built in potential across the PN junctions between the P type monocrystalline silicon substrate 30 and the N type silicon regions 34a and 34b. As the anodic reaction proceeds further, the porous silicon regions 40a', 40b', and 40c' extend along the bottoms of the N type silicon regions 34a and 34b and merge at the centers of the bottoms thereby forming the porous silicon region 40 as shown in FIG. 2G. Then, the silicon substrate 30 thus anodized is subjected to thermal oxidation at a temperature between 800° C. and 1100° C. for 1 to 10 hours. In a preferred embodiment, thermal oxidization is performed in a wet oxygen atmosphere at a temperature of 950° C. for 450 minutes. With this treatment, all of the porous silicon region 40 is converted into a porous silicon oxide region 41 (FIG. 2H). When subjected to this heat treatment, donors generated by the heat treatment step of FIG. 2D in the N type silicon regions 34a and 34b into which protons have been implanted disappear, whereby the N type silicon regions 34a and 34b are converted into P type silicon regions 43a and 43b. It is to be noted that these P type silicon regions do not contain any N type impurity. During the heat treatment described above, although the P type silicon regions 43a and 43b are also oxidized, since the oxidation speed of the porous silicon is above 10 to 20 times faster than that of the monocrystalline silicon, the P type silicon region would be oxidized only slightly when the porous silicon region is completely oxidized. Under the conditions described above, the thickness of the P type silicon region is about 0.3 micron and oxide films 44a and 44b, each having a thickness of one micron, is formed on the P type silicon region. After the heat treatment, the density of the porous silicon is about 50% of that of the monocrystalline silicon, and since the volume change of the porous silicon substrate caused by oxidation is small, warping of the wafer is small.

Then, the oxide films 44a and 44b formed on the P type silicon region are removed by buffer etching process utilizing hydrofluoric acid to obtain a state shown in FIG. 2I. Then, the substrate is heat treated in a pure oxygen atmosphere at a temperature of 1000° C. for 60 minutes to form a gate oxide film 45 having a thickness of 500 Å on the P type silicon regions 43a and 43b, as shown in FIG. 2J.

Then, a mixture of silane and arsenic trihydride (As H₃) is thermally decomposed by CVD method at a temperature between 700° to 800° C. for 10 to 20 minutes to form a polycrystalline silicon layer having an arsenic concentration of $10^{21}$ atoms/cm³ and a thickness of from 5000 Å to 1 micron. Then, the polycrystalline silicon layer is selectively etched to leave only portions which are used as gate electrodes and their wiring layers 46a and 46b, as shown in FIG. 2K. Although in the foregoing description, the impurity was incorporated into the polycrystalline layer concurrently with the formation thereof, the impurity may be incorporated by ion implantation or heat diffusion technique after the polycrystalline layer has been formed. The impurity incorporated into the polycrystalline layer is not limited to arsenic, but such other impurities as phosphor or boron can also be used.

Then, N type silicon regions $49_S$, $49_D$, $50_S$ and $50_D$ are formed in the P type silicon regions 43a and 43b by implanting ions of arsenic or phosphor into the entire principal surface of the silicon substrate 30 in the direction of arrows 48 shown in FIG. 2L. The ions of arsenic or phosphor are implanted at a density of $2\times10^{15}$ atoms/cm$^2$ under an acceleration voltage of 100 KeV, and then the substrate is annealed at a temperature of 1000° C. for 30 minutes. The N type silicon regions $49_S$ and $50_S$ thus formed are used as the source region, the regions $49_D$ and $50_D$ are used as a drain region and the remaining P type silicon regions 51c and 52c are used as an N channel region. This state is shown in FIG. 2L.

Then, nitrogen N$_2$, phosphor PH$_3$ and silane SH$_4$ are caused to react with each other by CVD method at a temperature of 450° C. to form an oxide film having a thickness of 5000 Å − 1 micron. Then, the oxide films 45 and 54 overlying the source and drain regions $49_S$, $50_S$, $49_D$ and $50_D$ are formed with contact windows $55_S$, $55_D$, $56_S$ and $56_D$. This state is shown in FIG. 2M.

Therefore, as shown in FIG. 2N, metal 57 such as aluminum is vapor deposited followed by an etching step according to a predetermined pattern to form source and drain electrodes and wiring layers 58, 59, 60 and 61, thus obtaining a final construction shown in FIG. 2O.

According to the method described above, the porous region is formed by using the selectivity for the P type and N type silicon regions to the anodic reaction to form an N type silicon region by implanting protons into a P type silicon substrate so as to form insulated and isolated regions so that it is possible to accurately control the dimension of the isolated regions.

This method is more advantageous over the method disclosed in U.S. Pat. No. 3,919,060 wherein an N type epitaxial layer is formed for producing a transistor island silicon region, and the epitaxial layer is then diffused with a P+ impurity for converting the epitaxial layer into islands. The method of this invention does not require such expensive steps thus simplifying the process steps and decreasing the manufacturing cost.

Figure 5:
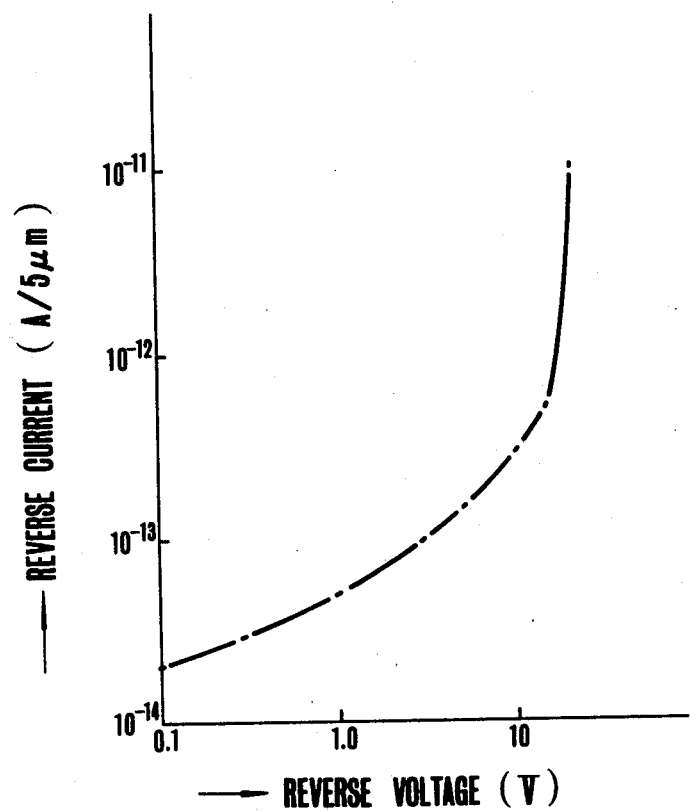
FIG. 5 is a graph showing the relationship between the reverse current and the reverse voltage at a PN junction formed in a semiconductor device embodying the invention.

FIG. 5 shows the reverse voltage-reverse current characteristic of the PN junctions of the transistor regions thus manufactured, that is, the PN junctions between the channel region and the source region and between the channel region and the drain region. Up to about 10 V, the reverse current varies in proportion to $\sqrt{V}$, where V represents the reverse voltage, and it is considered that this current is caused by generation-recombination in a depletion layer. As can be noted from this characteristic curve, the reverse current is externally small. This means excellent crystalline property and interface property of the transistor region.

Figure 6A:
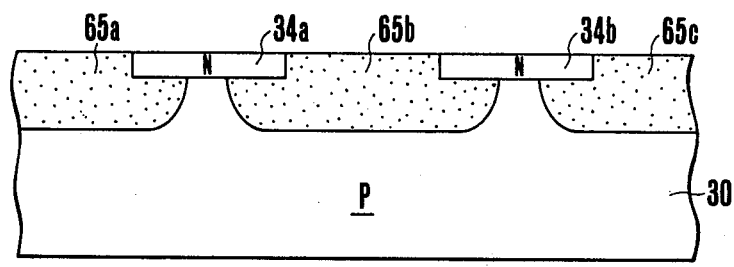
FIGS. 6a-6C show modified steps of the method of manufacturing a semiconductor device according to this invention.
Figure 6B:
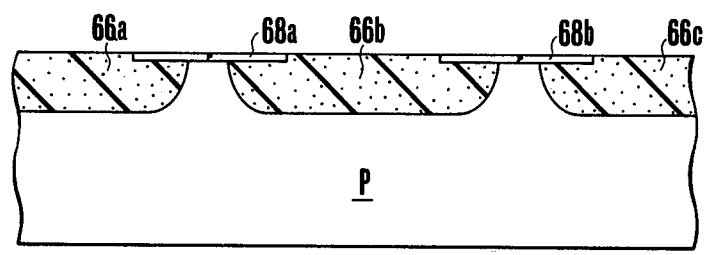
Figure 6C:
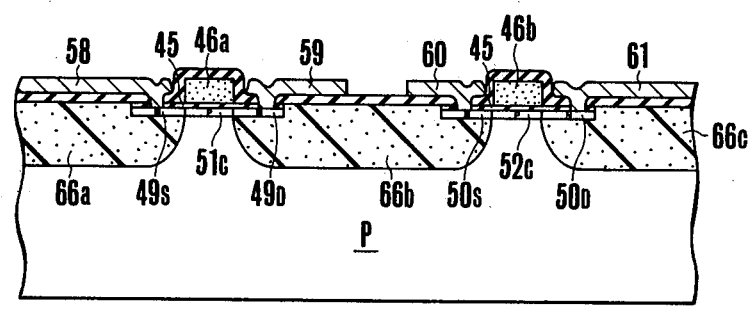

FIGS. 6A, 6B and 6C show modified embodiments of the semiconductor device of this invention. Thus, FIG. 6A shows a modified anodizing treatment shown in FIGS. 2E through 2G, the steps prior to that shown in FIG. 6A being the same as those shown in FIGS. 2A through 2F. The anodizing treatment shown in FIG. 6A is performed by passing current through the silicon substrate 30 at a density of 10 mA/cm$^2$ for 400 seconds. Under these conditions, when the width of each of the N type silicon regions 34a and 34b is 10 microns, the depth of the porous regions 65a, 65b, and 65c is 4 microns from the surface of the substrate 30 and the central portion of the N type silicon regions, the porous regions terminate at the central points about 3 microns spaced from the lower edges of the N type silicon regions.

Under this state, as can be noted from FIG. 6A, the N type regions 34a and 34b are in direct contact with the P type region of the substrate 30 at the central portions of the bottom surfaces of the N type regions and such direct contacted portions will be completely isolated later from the P type region of the substrate as shown in FIG. 2G of the previous embodiment.

Then, the silicon sustrate 30 is thermally oxidized at a temperature of from 800° C. to 1100° C. for 1 to 10 hours. Then, the porous silicon regions 65a, 65b and 65c are converted into porous silicon oxide regions 66a, 66b and 66c by thermal oxidation whereas the N type silicon region is converted into P type silicon regions because of the disappearance of the donors. This step corresponds to the step shown in FIG. 2H of the previous embodiment. Then, the oxide film overlying the P type silicon region is removed by a buffer etching technique utilizing hydrofluoric acid. This state is shown in FIG. 6B. Subsequent steps are identical to the steps shown in FIGS. 2J through 2N of the previous embodiment. At least an N channel type MIS field effect transistor having the construction shown in FIG. 6C can be obtained. In FIGS. 6A through 6C, elements prepared under the same conditions as in FIGS. 2A through 2C are designated by the same reference characters.

FIGS. 7A through 7F show successive steps of a modified method of manufacturing a semiconductor device according to this invention. In these figures, silicon semiconductor substrate 70 is prepared having a crystal orientation of (100), a specific resistance of 1 to 2 ohm.cm, and a P type impurity concentration of $1\times10^{16}$ atoms/cm$^3$, in the same manner as in the previous embodiments. Then, a silicon oxide film 71 having a thickness of 500 Å is formed on the principal surface of the substrate 70. This oxide film can be formed by, for example, maintaining the substrate in a dry oxygen atmosphere at 1000° C. for one hour.

Then, a mixture of ammonium and silane is heat-decomposed by CVD process to form on the oxide film a silicon nitride film (Si$_3$N$_4$) 72 having a thickness of about 2000 Å.

Figure 7A:
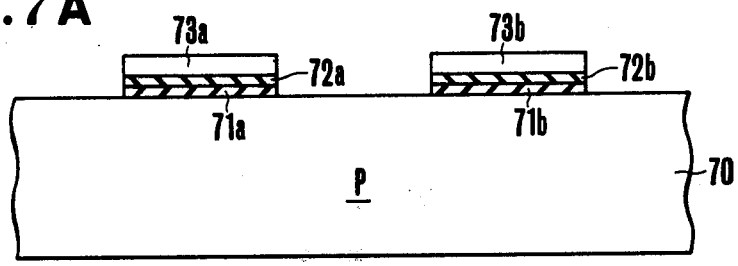
FIGS. 7A-7F show another modified steps of manufacturing a semiconductor device embodying the invention.

Then, a photoresistive layer 73 having a thickness of about 1 micron is selectively deposited on the silicon nitride film 72, the photoresistive layer being used as a mask layer. It should be understood that the mask layer 73 may be made of a SiO$_2$ film, or a metal film. Then the silicon nitride film 72 is plasma-etched by using the mask layer, and the SiO$_2$ film 71 is etched with hydrofluoric acid, thereby forming regions 71a, 71b, 72a, 72b, 73a and 73b. This state is shown in FIG. 7A.

At this step, the thickness of the silicon nitride film 72 is selected to be sufficiently thick enough to withstand later anodizing treatment and to act as an oxide mask in the subsequent thermal oxidation treatment of the porous silicon. The purpose of the silicon oxide films 71a and 71b is to alleviate the stress that will be created between the P type monocrystalline silicon substrate and the silicon nitride film during subsequent thermal oxidation treatment of the porous silicon region. For this reason, the silicon oxide films 71a and 71b may be omitted.

Figure 7B:
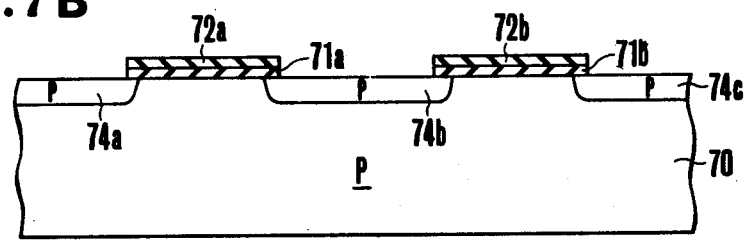

With use of the photoresistive layers 73a and 73b as a mask layers, ions of such group III impurity as boron and gallium are implanted from above into the silicon substrate under an acceleration voltage of 40 KeV and at a concentration of $5\times10^{13}$ atoms/cm$^2$. Then, after removal of the mask layers 73a and 73b, the substrate is annealed at a temperature of 1100° C. for 30 minutes to form P+ regions 74a, 74b, and 74c each having a depth of about 1 micron as shown in FIG. 7B. This P+ region has a high impurity concentration and hence a low specific resistance. The impurity concentration of this region is selected so that protons or donors of a group V impurity to be incorporated in a later step can be cancelled.

In an alternative embodiment, the ion implantation technique utilized in this modification is replaced by thermal diffusion technique. If necessary, during the ion implantation step the photoresist 73a and 73b shown in FIG. 7A may be left.

Figure 7C:
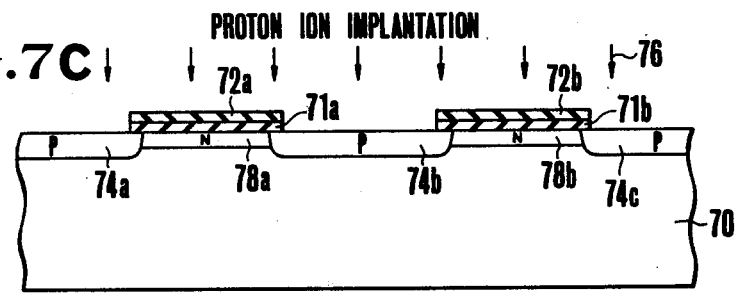
Figure 7D:
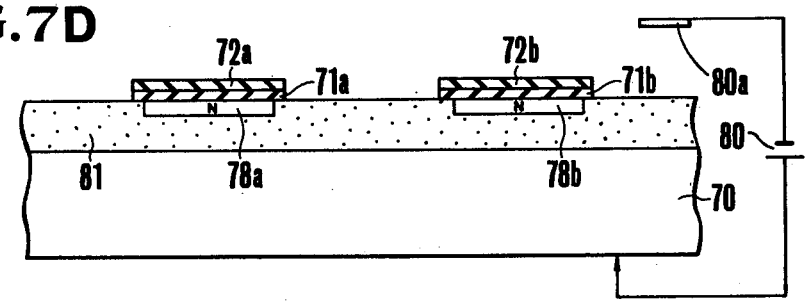

Then, as shown in FIG. 7C, protons are implanted into the principal surface of the P type monocrystalline silicon substrate 70 in the direction shown by arrows 76, and then the substrate is heat-treated to form N type silicon regions 78a and 78b under the oxide films 71a and 71b, respectively. Proton implantation is performed under an acceleration voltage of 100 KeV, and, thereafter, the substrate is annealed at a temperature of 300° to 500° C. for 30 minutes. As a consequence, N type silicon regions 78a and 78b each having a thickness of 5500 Å, are formed beneath the principal surface. When the substrate is heat-treated at a relatively low temperature of from 300° to 500° C. after the proton implantation step, donors are created in the proton implanted region thereby forming a N type silicon region. The relationship between the dose of implanted protons and the amount of donors created thereby is illustrated in FIG. 3. Then, as shown in FIG. 7D, the substrate 70 is dipped in a 25-50%, by weight, of hydrofluoric acid solution with the bottom surface of the substrate connected to the positive side of a DC source 80 and the negative side thereof connected to a platinum electrode 80a which is dipped in the solution at a position spaced from the substrate. Under these conditions, the silicon substrate is anodized by passing current therethrough at a density of 10 mA/cm² for 1000 seconds in the same manner as has been described in connection with preceding embodiments.

As a result of this anodizing treatment, the P type silicon region is converted into a porous structure 81 to a depth of about 10 microns from the principal surface.

As a consequence, all sidewalls and bottom surfaces of the N type silicon regions 78a and 78b are surrounded by the porous silicon region 81. This state is shown in FIG. 7D.

Figure 7E:
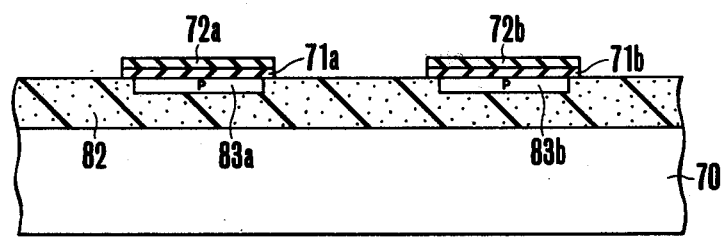

The anodized silicon substrate 70 is thereby oxidized at a temperature of from 800° C. to 1100° C. to convert the porous silicon region 81 to a porous silicon oxide region 82. At the same time, the donors in the N type silicon region which have been implanted with protons during the heat treatment step disappear, thereby converting the N type silicon regions 78a and 78b into P type silicon regions 83a and 83b. This state is shown in FIG. 7E.

Figure 7F:
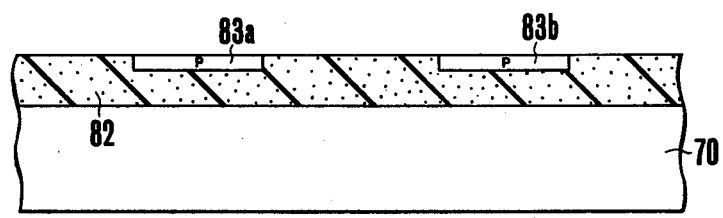

Then, the silicon nitride films 72a and 72b and the SiO₂ films 71a and 71b are removed by a well known etching technique. As a consequence, the construction shown in FIG. 7F is obtained in which the P type silicon regions 83a and 83b on the principal surface of the P type silicon substrate 70 are electrically isolated by the porous silicon oxide region 82.

Subsequent steps are identical to steps shown in FIGS. 2J through 2O thus obtaining a MIS type field effect transistor having the construction as shown in FIG. 2O.

When the method described above is carried out, and when the heat treatment is performed subsequent to the anodizing treatment shown in FIG. 7D, as the surfaces of the N type silicon regions 78a and 78b are covered by the Si₃N₄ films 72a and 72b and SiO₂ films 71a and 71b, the upper surface of the P type silicon region produced by the heat treatment would not be covered by an oxide film as shown in FIG. 2H. Accordingly, it is possible to obtain a P type silicon region having a larger depth than the previous embodiment. When the porous film is oxidized while the N type silicon region is being covered by such oxidation resistant films as the silicon nitride films 72a and 72b and the silicon dioxide films 71a and 71b, the surface irregularity of the substrate surface disappears after the oxidization treatment thus improving the yield of satisfactory products. With the method of this invention, a single acid resistant mask can be used as an oxidation preventing mask and as an impurity implantation mask thus eliminating aligning of masks and simplifying the process steps.

In the above described embodiments, an MIS field effect transistor having a channel of one conductivity type on the P type silicon substrate was shown. According to this invention, it is possible to obtain a so-called complementary MIS field effect transistor including a combination of N channel type and P channel type.

Figure 8:
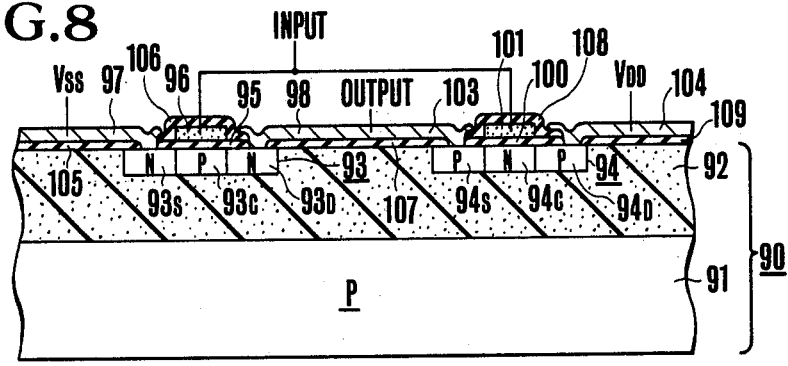
FIG. 8 is a longitudinal sectional view showing one example of a complementary transistor obtainable by the method of this invention.

FIG. 8 shows one example of such complementary transistor embodying the invention which comprises a P type silicon region 91 of a silicon substrate 90, a porous silicon oxide region 92 formed to a predetermined depth from the principal surface of the silicon substrate 90, and transistor regions 93 and 94 formed on the principal surface of the silicon substrate 90 and surrounded by the porous silicon oxide region 92. The side surfaces and the bottom surfaces of the transistor regions are also surrounded by the porous silicon oxide region 92, whereby these regions are perfectly insulated and isolated from the other portions.

The transistor region 93 is constituted by an N type silicon source region 93$_S$, a P type silicon channel region 93$_C$ acting as an N channel and an N type silicon drain region 93$_D$ so as to form an N channel type MIS field effect transistor. The upper surface of the P type channel region 93$_C$ and a portion of the upper surface of the source and drain regions 93$_S$, 93$_D$ adjacent the region 93$_C$ are covered by a gate insulating film 95 made of SiO₂, for example, and a gate electrode and its wiring layer 96 made of polycrystalline silicon doped with an impurity is formed on the gate insulating film 95. Further, a source electrode, a gate electrode and wiring layers 97 and 98 are formed on the source and drain regions 93S and 93D. These elements constitute an N channel transistor of this invention.

The transistor region 94 comprises a P type silicon source region 94$_S$, an N type channel region 94$_C$ acting as a P channel and a P type drain region 94$_D$ so as to constitute a P channel type MIS field effect transistor together with the above-mentioned N channel type MIS field effect transistor. The upper surface of the channel region 94$_C$ and a portion of the upper surface of the source and drain regions 94$_S$, 94$_D$ adjacent thereto are covered with a gate insulating film 100 made of SiO₂, for example, and the gate insulating film 100 is covered by a gate electrode and wiring layer 101 made of polycrystalline silicon doped with an impurity. Source and gate electrodes and wiring layers 103 and 104 (layer 103 is connected to layer 98) are formed on the source and drain regions 94$_S$ and 94$_D$ through contact regions. In FIG. 8, reference numerals 105, 107 and 109 denote such insulating films as SiO₂ films.

The gate electrodes 96 and 101 of the N type channel transistor and the P type channel transistor respectively are commonly connected to an input terminal, while the layer 98 of the N channel transistor and the layer 103 of the P channel transistor, respectively are commonly connected to an output terminal. Furthermore, the layer 104 of the P type channel transistor is connected to a source of supply $V_{DD}$, and the layer 97 of the P type channel transistor is connected to a source of supply $V_{SS}$, thereby providing a complementary transistor which is capable of operating at a higher speed and can be fabricated at higher densities than the prior art.

A method of manufacturing a complementary semiconductor device described above will now be described with reference to FIGS. 9A through 9K.

Figure 9A:
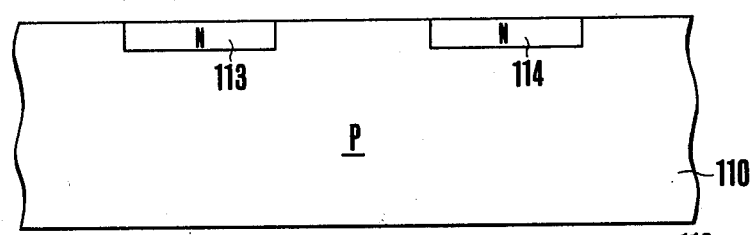
FIGS. 9A-9K show one example of the steps of the method of manufacturing the transistor shown in FIG. 8.
Figure 9B:
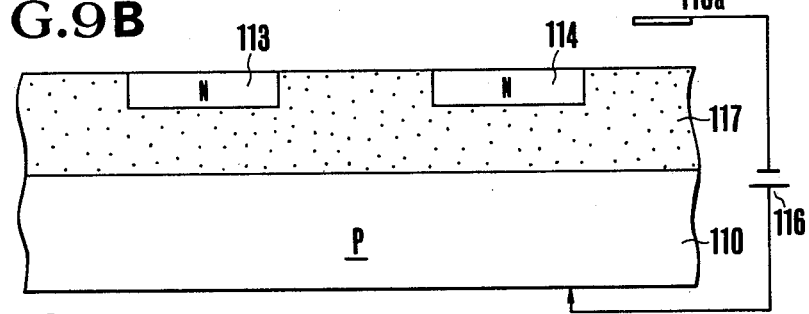
Figure 9C:
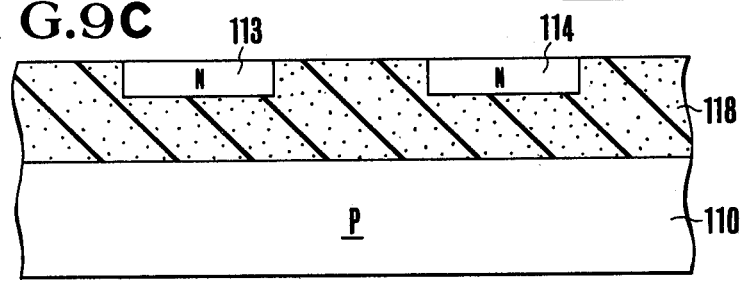

Like another embodiments, a semiconductor substrate 110 is prepared having a crystal orientation of (100), a specific resistance of 1–2 ohm.cm and a P type impurity concentration of $1 \times 10^{16}$ atoms/cm$^3$. The acceptor concentration of the substrate may be less than the concentration which would permit conversion of the substrate into N type silicon by implanting proton acceptors according to the following method. At first, ions of such Group V impurity as arsenic or phosphor are selectively implanted into a portion where an N type silicon region is to be formed. Then, protons are implanted into a portion where a P type silicon region is to be formed. Then, the substrate is heat-treated to form N type silicon regions 113 and 114. It should be noted that the region 113 has been implanted with protons. The regions formed by implantation of the protons is then heat-treated at a temperature of 300°–500° C. in inert gas atmosphere so as to generate donors in the region 113 in the same manner as in the preceding embodiments. The condition of ion implantation into the N type silicon region 114 is 250 KeV acceleration voltage and a dose of $1 \times 10^{13}$ atoms/cm$^2$ where phosphor ions are implanted. Thereafter, the substrate is heat-treated at 1000° C. for 50–100 minutes in an inert gas atmosphere. Instead of ion implanation, the region 114 can also be formed by a heat diffusion technique. The regions 113 and 114 thus formed have a depth of about 0.8 micron. The substrate is then dipped in a 25–50%, by weight, of hydrofluoric acid solution with the bottom of the substrate connected to the positive side of a DC source 116, and the negative side of the DC source connected to a platinum electrode 116a immersed in the solution. Then, the DC source 116 passes current through the silicon substrate 110 at a density of 10 mA/cm$^2$ for 1000 seconds for anodizing the same. As a consequence, the anodic reaction takes place at portions of the principal surface of the P type silicon substrate 110 other than the N type silicon regions 113 and 114 and forms a porous silicon region 117 having a thickness of 10 microns which completely surrounds the side surfaces and the bottom surfaces of the N type silicon regions 113 and 114 as shown in FIG. 9B. Since the process steps up to a step for forming the anodized region 117 are identical to the steps shown in FIGS. 2E through 2G, their description is believed unnecessary. For the purpose of preventing the anodizing current from flowing through the N type silicon regions 113 and 114, the voltage of the source 116 should be less than the built-in potential at the PN junction between the N type silicon regions.

Figure 9D:
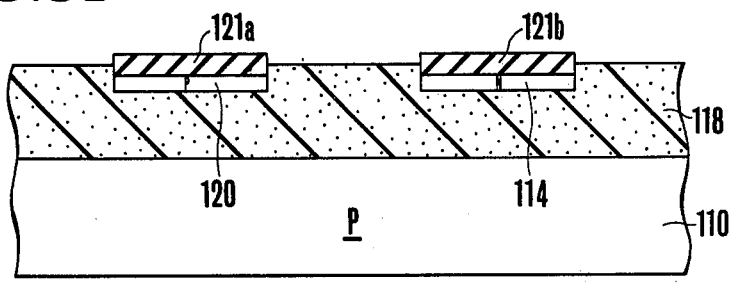
Figure 9E:
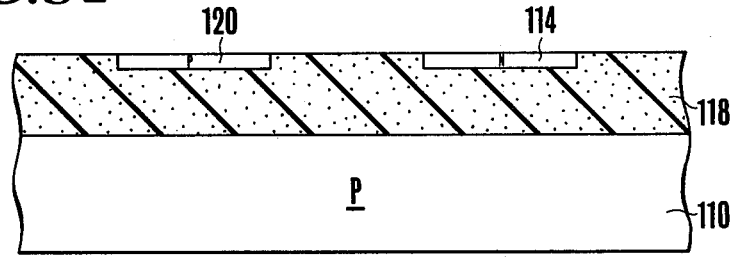

Then, the anodized P type monocrystalline silicon substrate 110 is heat oxidized at a temperature of 800° to 1100° C. preferably 950°–1100° C. to convert the porous silicon region 117 into a porous silicon oxide region 118. Due to this heat treatment, the donors that have been generated in the proton implanted N type silicon region 113 disappear, thereby converting the N type silicon region 113 into a P type silicon region 120. Consequently, this P type silicon region 120 does not contain any N type impurity. Furthermore, during this heat treatment, the N type silicon region 114 tends to expand outwardly, but since this region is surrounded by the porous silicon oxide layer 118, it does not expand outwardly in any appreciable extent. In other words, the N type silicon region is not affected by the heat treatment. However, the P type silicon region 120 and the N type silicon region 114 are oxidized slightly due to the heat treatment. Since the oxidation speed of the porous silicon is larger than that of monocrystalline silicon, at the time when the porous silicon region has been completely oxidized, the P and N type silicon regions 120 and 114 are oxidized only slightly. Under the conditions described above, the silicon regions 114 and 120 have a thickness of 0.3 micron and oxide films 121a and 121b each have a thickness of 1 micron. This state is shown in FIG. 9D. Then, buffer etching with hydrofluoric acid is performed to remove oxide films 121a and 121b which were formed on respective silicon island regions 120 and 114. This state is shown in FIG. 9E.

Figure 9F:
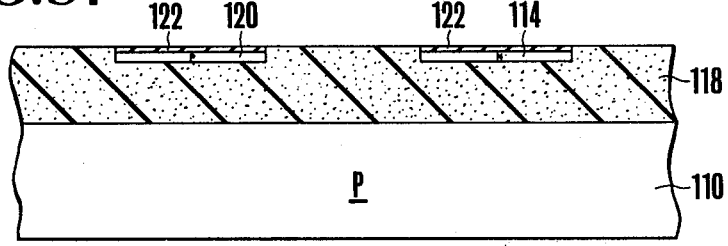
Figure 9G:
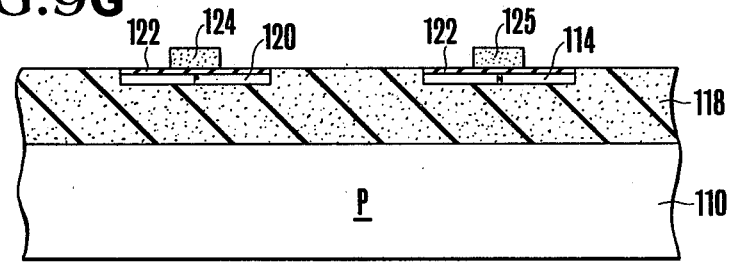

Then, a gate insulating film 122 is formed by a well known method as shown in FIG. 9F followed by the formation of a polycrystalline silicon layer containing arsenic at a concentration of about $1 \times 10^{21}$ atoms/cm$^3$ and having a thickness of from about 5000 Å to 1 micron by CVD method. Then, the polycrystalline layer is selectively etched to form gate electrodes and their wiring layers 124 and 125. Although in the foregoing description, an impurity was incorporated into the polycrystalline silicon layer concurrently with the formation thereof, the impurity may be incorporated by ion implantation or a heat diffusion technique after the polycrystalline silicon layer has been formed. The impurity incorporated into the polycrystalline silicon layer is not limited to arsenic, but phosphor or boron can also be used.

Figure 9H:
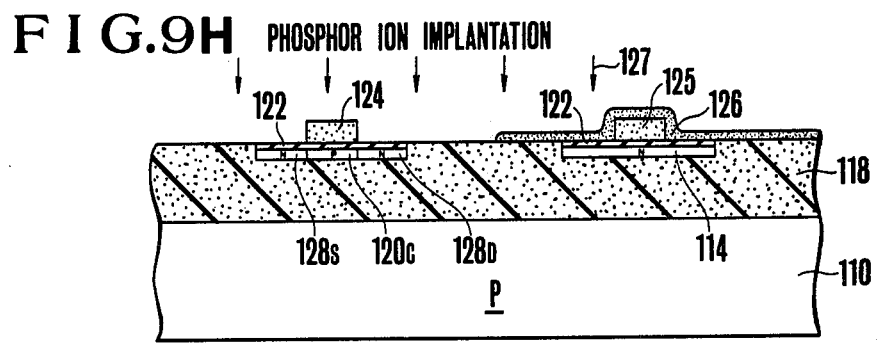

Then, a photoresist or a metal layer having a thickness of about 1 micron and acting as a mask 126 is selectively deposited on the P channel transistor region on the substrate 110 as shown in FIG. 9H. Then, ions of arsenic or phosphor are implanted in a direction shown by arrows 127 in FIG. 9H to form N type silicon regions 128S and 128D in the P type silicon region 120. At this time, the gate electrode 124 is used as a mask. The ions of arsenic or phosphor are implanted at a concentration of $2 \times 10^{15}$ atoms/cm$^2$ and under an acceleration voltage of 100 KeV. Thereafter, the assembly is annealed at a temperature of 1000° C. for 30 minutes. Of the P type silicon regions thus formed, the region 128S is used as a source region, the region 128D as a drain region and the remaining P type silicon region 120C is used as a N channel region.

Figure 9I:
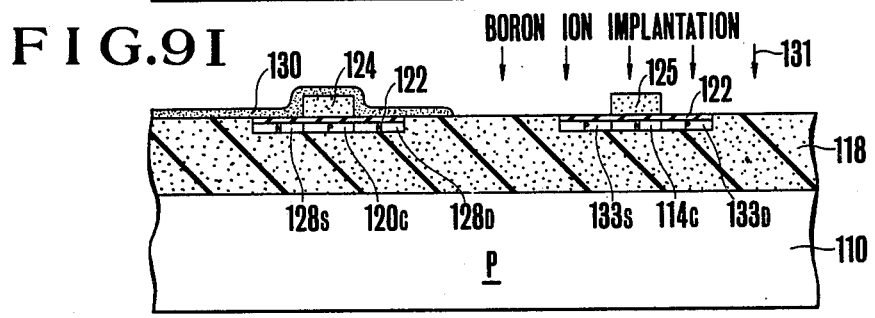

After removing the mask by a well known method, a photoresist or a metal layer acting as a mask 130 and having a thickness of about 1 micron is selectively deposited on the N channel transistor region as shown in FIG. 9I. Then, ions of boron are implanted in the direction of arrows 131 shown in FIG. 9I to form P type silicon regions 133S and 133D in the N type silicon region 114. At this time, the gate electrode 125 is used as a mask. Ions of boron are implanted at a concentration of $2 \times 10^{15}$ atoms/cm$^2$ and under an acceleration voltage of 40 KeV. Then, the assembly is annealed at a temperature of 1000° C. for 30 minutes. Of the P type silicon regions thus formed, the region 133$_S$ comprises a source region, the region 133$_D$ a drain region and the remaining region 114$_C$ a P channel region.

Figure 9J:
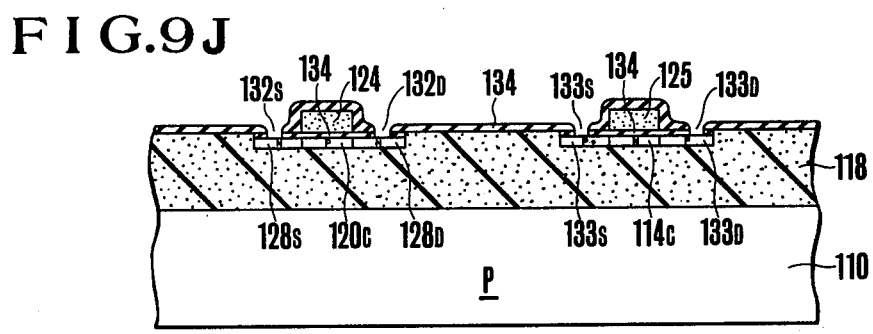
Figure 9K:
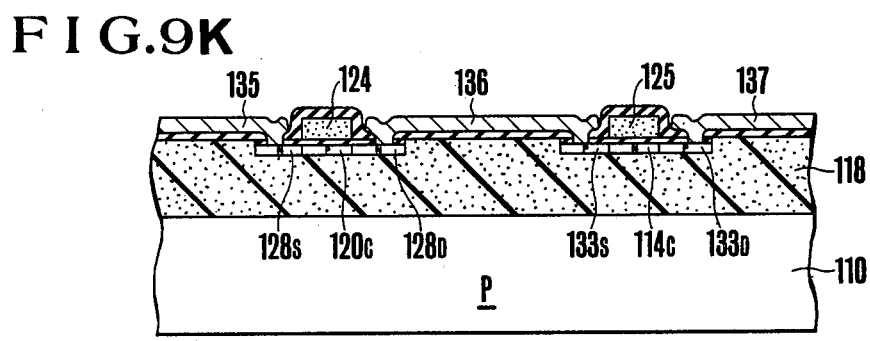

After removing the mask by a well known method, an oxide film having a thickness of 5000 Å to 1 micron is formed by CVD method. Then, the oxide films 122 and 134 overlying the source and drain regions 128$_S$, 133$_S$, 128$_D$ and 133$_D$ are formed with contact windows 132$_S$, 133$_S$, 132$_D$, 133$_D$. This state is shown in FIG. 9J. Then, as shown in FIG. 9K, metal films 135, 136 and 137 made of aluminum, for example, are selectively vapor-deposited to form source and drain electrodes and their wiring layers. The semiconductor device thus formed has the same construction as that shown in FIG. 8.

Figure 10:
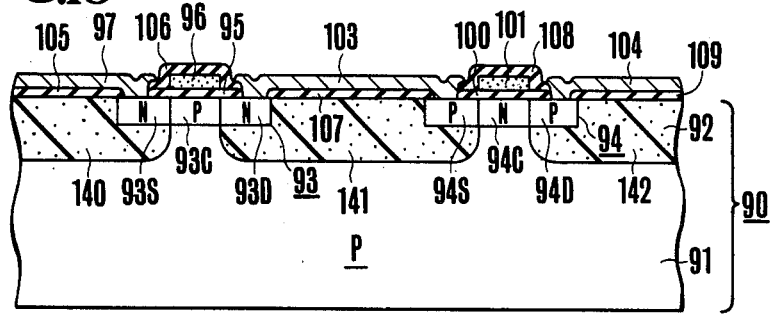
FIG. 10 is a transversal sectional view showing a modification of the transistor shown in FIG. 8.

FIG. 10 illustrates a modification of the semiconductor device shown in FIG. 8 which is different therefrom in that the porous silicon oxide regions 140, 141 and 142 surrounding the transistor regions 93 and 94 do not cover a portion of the bottoms of regions 93 and 94. This construction permits direct connection between the channel region 93$_C$ of the N channel transistor and the P type silicon substrate without directive property.

FIGS. 11A through 11F show successive steps of manufacturing a semiconductor device of their invention, particularly the complementary transistor shown in FIG. 8 according to a modified method. Again, oxidation resistant films are used as in the steps shown in FIGS. 7A through 7F. As the steps shown in FIGS. 11A through 11F are similar to those shown in FIGS. 7A through 7F, they will be described briefly.

At first, on the principal surface of a P type monocrystalline silicon substrate 150 having the same characteristics as the silicon substrate 70 shown in FIG. 7A are selectively formed a silicon oxide film 151$a$ having a thickness of about 500 Å and Si$_3$N$_4$ films 152$a$ and 152$b$ each having a thickness of about 2000 Å by using mask layers 153$a$ and 153$b$ each having a thickness of about one micron. The thickness of the Si$_3$N$_4$ films is selected such that they can withstand subsequent anodic reaction and can be converted into oxidized mask by the succeeding thermal oxidation treatment. In this example, the silicon oxide films 151$a$ and 151$b$ may be omitted. If desired, the mask layers utilized to selectively form the SiO$_2$ films and the Si$_3$N$_4$ films may be left on the Si$_3$N$_4$ films for subsequent ion implantation. In this example, however, these films are etched off.

Figure 11A:
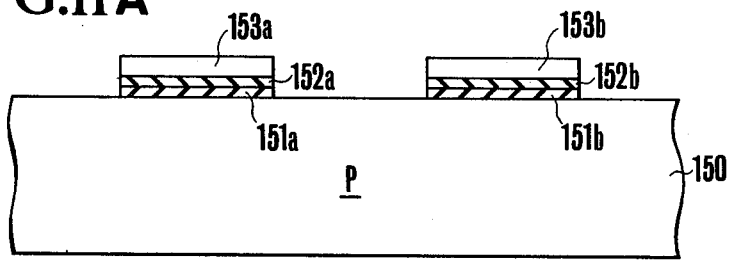
FIGS. 11A-11F are sectional views showing the steps of a modified method of manufacturing the transistor shown in FIG. 8.
Figure 11B:
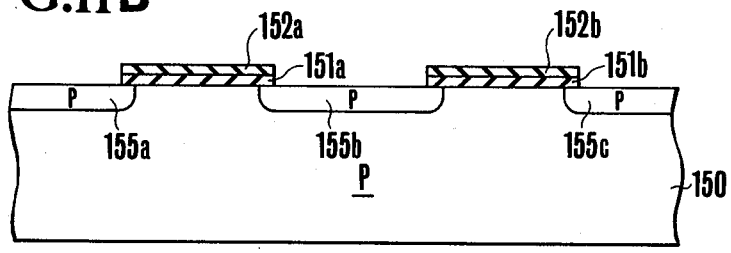

Then, as shown in FIG. 11B, ions of such group III impurity as boron, gallium etc. are selectively incorporated into the principal surface of a monocrystalline P type silicon substrate 150 by ion implantation or a heat diffusion technique so as to form P type silicon regions 155$a$, 155$b$ and 155$c$ containing a P type impurity at a high concentration and having a high specific resistance in regions except that underlying the Si$_3$N$_4$ film. The concentration distribution of the impurity in these P type silicon regions is selected to be large enough to cancel the donors generated by the protons or a group V impurity to be incorporated in a later step. For example, a concentration of 10$^{18}$ atoms/cm$^3$ is preferred.

Figure 11C:
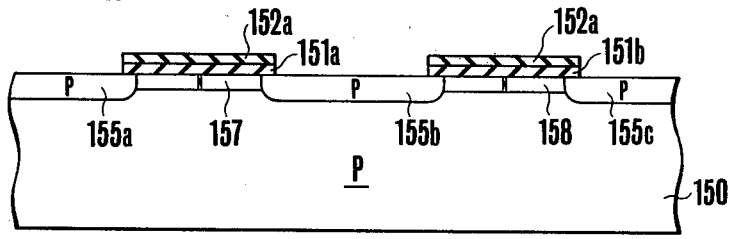

Then, as shown in FIG. 11C, a group V impurity is selectively incorporated. After heat treatment, protons are selectively implanted into the principal surface of the substrate 150 of the P type monocrystalline silicon substrate 150. At this time, protons are implanted under an acceleration voltage so that the peak of the impurity concentration appears near the principal surface. Thereafter, the substrate is annealed at a temperature of 300° to 500° C. for 30 minutes, thereby forming an N type silicon region 157 having a thickness of 5500 Å beneath the principal surface. At the time of ion implantation, portions not wanted to be implanted with ions are covered with a mask of photoresistive or metal layer in the same manner as the step shown in FIG. 9H. Where phosphor is used as the impurity, the ions are implanted at a density of 1×10$^{13}$ atoms/cm$^2$ under an acceleration voltage of 250 KeV, and then the substrate is annealed in an inert atmosphere at 1000° C. for 60 minutes. Accordingly, an N type region 158 having the same thickness as that of the region 157 is formed under the principal surface. In the same manner as above described, the portions which are not to be implanted with ions of a group V impurity are covered by masks. During the proton implantation step and the group V impurity incorporation step, the P type silicon regions 155$a$ through 155$c$ still maintain the P type conductivity.

Figure 11D:
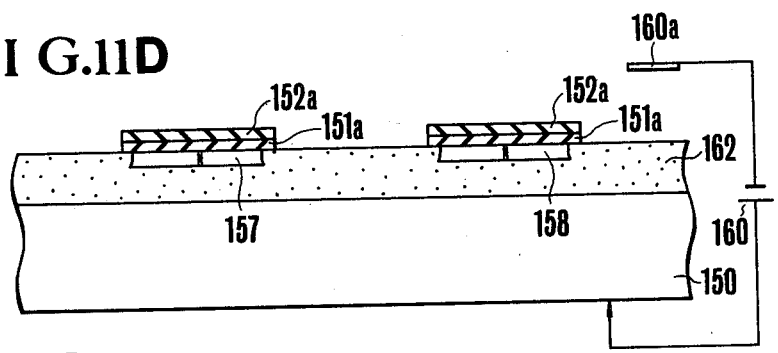
Figure 11E:
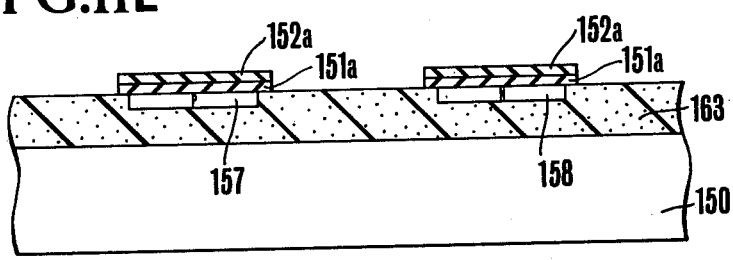

Then, as shown in FIG. 11D, the substrate 150 is immersed in a hydrofluoric acid solution with the bottom surface of the substrate connected to the positive side of a DC source 160 and the negative side connected to a platinum electrode 160$a$ which is immersed in the solution at a position spaced from the substrate. Then, an anodizing treatment is performed by passing current through the substrate 150 at a density of 10 mA/cm$^2$ for 1000 seconds to form a porous silicon region 162 to a depth of about 10 microns from the principal surface. Then, the substrate is subjected to a thermal oxidation treatment at a temperature of 800° to 1100° C. for ten hours to convert the porous silicon region 162 into a porous silicon oxide region 163. This state is shown in FIG. 11E.

Figure 11F:
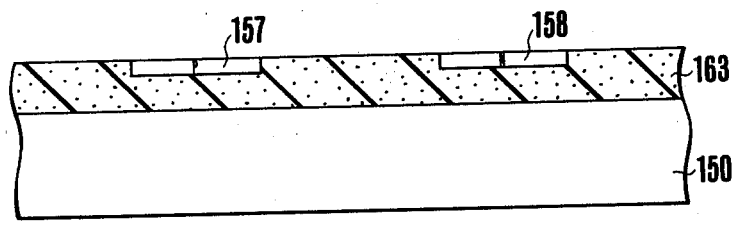

Then, the Si$_3$N$_4$ films 152$a$, 152$b$ and the SiO$_2$ films 151$a$, 151$b$ are etched off by a well known method. This state is shown in FIG. 11F which corresponds to FIG. 9E. The steps succeeding the step shown in FIG. 11F are identical to those shown in FIGS. 9F through 9K.

It should be understood that the invention is not limited to the preceding embodiments and that many changes and modifications would be obvious to one skilled in the art. For example, in the embodiment illustrated in FIGS. 9A through 9K, the N type silicon region 114 may be formed after the P type silicon region 120 has been formed. Then, at the step shown in FIG. 9D, after the oxide film on the P type silicon region 120 has been selectively removed, the region 114 is formed by incorporating a group V impurity into one of the P type silicon region by using the oxide mask, thereby forming the region 114. Thereafter, the oxide film is removed to reach the step shown in FIG. 9E. Furthermore, if desired, the P type silicon island region formed by the proton implantation and the heat treatment in the foregoing embodiments may be imparted with a desired impurity concentration by doping a group III impurity at a suitable step, for example at the step shown in FIG. 2I.

What is claimed is:
1. A method of manufacturing a semiconductor device comprising the steps of selectively implanting proton ions into a principal surface of a P type monocrystalline silicon substrate;
heating said silicon substrate to form an N type monocrystalline silicon region;
anodizing said substrate to form a porous silicon region extending in a thickness direction from the major surface of said P type monocrystalline substrate except said N type silicon region, said porous silicon region being formed to contact with all side surfaces and at least a portion of a bottom surface of said N type silicon region; and thermally oxidizing said porous silicon region for converting the same into a porous silicon oxide region while at the same time converting said N type silicon region into a P type silicon region.

2. The method of manufacturing a semiconductor device according to claim 1 wherein said porous silicon region is formed to contact the entire bottom surface of said N type silicon region.

3. The method of manufacturing a semiconductor device according to claim 1 wherein said silicon substrate is heated to a temperature of from 300° to 500° C. to form said N type silicon region.

4. The method of forming a semiconductor device according to claim 1 wherein said silicon substrate is heated to a temperature of from 850° C. to 1100° C. for forming said porous silicon oxide region.

5. The method of manufacturing a semiconductor device according to claim 1 which further comprises the steps of applying oxidation resistant film on a portion of said monocrystalline silicon substrate where said N type silicon region is to be formed, before implanting said proton ions, and removing said oxidation resistant film after said N type silicon region has been converted into said P type silicon region.

6. The method of manufacturing a semiconductor device according to claim 1 which further comprises a step of selectively incorporating a group V impurity into said monocrystalline silicon substrate prior to implant said proton ions thereby to form an N type silicon region.

7. The method of manufacturing a semiconductor device according to claim 1 further comprising a step of selectively incorporating a group V impurity into said P type silicon region thereby forming an N type silicon region.

8. The method according to claim 1 which further comprises a step of incorporating an N type impurity into said P type silicon region to form source and drain regions thereby forming an N channel type MIS field effect transistor.

9. The method of manufacturing a semiconductor device according to claim 5 which further comprises a step of incorporating a group V impurity into a region beneath said oxidation resistant film to form an N type silicon region concurrently with the implantation of said proton ions.

10. The method of manufacturing a semiconductor device according to claim 5 which further comprises a step of selectively incorporating a group V impurity into said P type silicon region to form an N type silicon region.

11. The method according to claim 6 which further comprises a step of incorporating a P type impurity into said N type silicon region doped with said group V impurity to form source and drain regions thus obtaining a P channel type MIS field effect transistor.

* * * * *